United States Patent
Katada et al.

(10) Patent No.: US 7,796,442 B2
(45) Date of Patent: Sep. 14, 2010

(54) NONVOLATILE SEMICONDUCTOR MEMORY DEVICE AND METHOD OF ERASING AND PROGRAMMING THE SAME

(75) Inventors: Mitsutaka Katada, Hoi-gun (JP); Yukiaki Yogo, Okazaki (JP); Akira Tai, Okazaki (JP); Yukihiko Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 148 days.

(21) Appl. No.: 12/078,446

(22) Filed: Mar. 31, 2008

(65) Prior Publication Data

US 2008/0239817 A1    Oct. 2, 2008

(30) Foreign Application Priority Data

Apr. 2, 2007  (JP) .............................. 2007-096702
Jan. 29, 2008  (JP) .............................. 2008-018335

(51) Int. Cl.
  *G11C 16/04*  (2006.01)
(52) U.S. Cl. .............................. 365/185.29; 365/185.26; 365/185.02; 365/218; 365/185.1
(58) Field of Classification Search ............ 365/185.29, 365/185.1, 185.26, 185.02, 218
See application file for complete search history.

(56) References Cited

U.S. PATENT DOCUMENTS

| 5,225,362 | A | * | 7/1993 | Bergemont | ................ | 438/261 |
| 5,268,319 | A | * | 12/1993 | Harari | ................ | 438/260 |
| 5,293,331 | A | * | 3/1994 | Hart et al. | ............... | 365/185.02 |
| 5,455,792 | A | * | 10/1995 | Yi | ................ | 365/185.15 |
| 5,535,158 | A | | 7/1996 | Yamagata | | |
| 5,544,103 | A | * | 8/1996 | Lambertson | ............ | 365/185.15 |
| 5,706,227 | A | * | 1/1998 | Chang et al. | ............ | 365/185.18 |
| 5,780,341 | A | * | 7/1998 | Ogura | ................ | 438/259 |
| 5,867,425 | A | * | 2/1999 | Wong | ................ | 365/185.08 |
| 5,912,488 | A | * | 6/1999 | Kim et al. | ................ | 257/316 |

(Continued)

FOREIGN PATENT DOCUMENTS

JP    A-56-129374    10/1981

(Continued)

OTHER PUBLICATIONS

A. T. Wu et al, "A Source-Side Injection Erasable Programmable Read-Only Memory SI-EPROM) Device", Sep. 1986, IEEE Electron Device Letters, vol. EDL-7, No. 9, pp. 540-542.*

*Primary Examiner*—Viet Q Nguyen
(74) *Attorney, Agent, or Firm*—Posz Law Group, PLC

(57) ABSTRACT

A nonvolatile semiconductor memory device includes a semiconductor substrate having a source, a drain, and a channel region between the source and the drain. The channel region has a first end portion near the drain, a second end portion near the source, and a middle portion between the first and second end portions. The first and second end portions having approximately same width. The memory device is electrically erased by using a hot carrier generated in the first end portion due to avalanche breakdown. The channel region includes a first channel extending from the drain and a second channel adjacent to the first channel. An impurity concentration of the second channel is higher than that of the first channel. An interface between the first and second channels is located in the middle portion between the first and second end portions.

11 Claims, 9 Drawing Sheets

U.S. PATENT DOCUMENTS

| | | | |
|---|---|---|---|
| 6,121,087 A * | 9/2000 | Mann et al. | 438/258 |
| 6,157,058 A * | 12/2000 | Ogura | 257/315 |
| 6,214,666 B1 * | 4/2001 | Mehta | 438/257 |
| 6,272,050 B1 * | 8/2001 | Cunningham et al. | 365/185.28 |
| 6,462,988 B1 * | 10/2002 | Harari | 365/185.22 |
| 7,009,244 B2 * | 3/2006 | Jenq et al. | 257/316 |
| 7,045,848 B2 * | 5/2006 | Shukuri | 257/311 |

FOREIGN PATENT DOCUMENTS

| | | |
|---|---|---|
| JP | A-2008-4831 | 1/2008 |
| JP | A-2008-60466 | 3/2008 |
| JP | A-2008-60467 | 3/2008 |

* cited by examiner

NONVOLATILE SEMICONDUCTOR MEMORY DEVICE AND METHOD OF ERASING AND PROGRAMMING THE SAME

CROSS REFERENCE TO RELATED APPLICATION

This application is based on and incorporates herein by reference Japanese Patent Applications No. 2007-96702 filed on Apr. 2, 2007 and No. 2008-18335 filed on Jan. 29, 2008.

FIELD OF THE INVENTION

The present invention relates to a nonvolatile semiconductor memory device and a method of erasing and programming the memory device.

BACKGROUND OF THE INVENTION

A nonvolatile semiconductor memory device has been proposed that has a stacked gate structure, in which a floating gate and a control gate are stacked. For example, a nonvolatile semiconductor memory device disclosed in JP-A-S56-129374 employs a hot hole (HH) injection mechanism to erase data. In the hot hole (HH) injection mechanism, data stored in the memory device is erased by injecting a hot hole into a floating gate. The hot hole is generated by avalanche breakdown between a drain and a semiconductor substrate.

The present inventors have investigated a relationship between the number of erase and program cycles and a change in a threshold voltage of a conventional stacked gate nonvolatile semiconductor memory device. The memory device is programmed by injecting a hot electron, which flows from a source and a drain, into a floating gate near a drain and erased by injecting a hot hole, which is generated due to avalanche breakdown between the drain and a semiconductor substrate, into the floating gate. The investigation has been conducted using five threshold data obtained per each erase and program cycle at a temperature of 25 degrees Celsius (° C.). The result of the investigation shows that the decrease in a programmed threshold voltage increases with an increase in the number of erase and program cycles. Therefore, erase and program cycle endurance of such a stacked gate nonvolatile semiconductor memory device may be low.

SUMMARY OF THE INVENTION

In view of the above-described problem, it is an object of the present invention to provide a nonvolatile semiconductor memory device for minimizing a decrease in a programmed threshold voltage and to provide a method of erasing and programming the memory device.

According to an aspect of the present invention, a nonvolatile semiconductor memory device includes a first conductive type semiconductor substrate having a second conductive type source and a second conductive type drain that are formed near a surface of the substrate and spaced apart from each other, a floating gate disposed on a channel region of the substrate through an electrically insulating film, and a control gate at least partially capacitively coupled to the floating gate. The channel region is located between the source and the drain and have a first end portion near the drain, a second end portion near the source, and a middle portion between the first and second end portions. The first and second end portions have approximately same width. The memory device is electrically erased by a hot carrier generated in the first end portion of the channel region due to avalanche breakdown between the substrate and the drain. The channel region has a high electric field zone, where an electric field in the channel region reaches a maximum during a program operation. The high electric field zone is located in the middle portion between the first and second end portions of the channel region.

According to another aspect of the present invention, a method of erasing and programming a nonvolatile semiconductor memory device, which has a split gate structure with floating and control gates disposed through an insulating film on a channel region located between a source and a drain formed near a surface of a semiconductor substrate, includes forming a hot electron by exciting an electron flowing through the channel region in a high-energy state during an program operation, programming data by injecting the hot hole into the floating gate, forming a hot hole by causing avalanche breakdown between the drain and the substrate during an erase operation, and erasing the data by injecting the hot hole into the floating gate. The control gate includes a stacked portion stacked on and capacitively coupled to the floating gate and an extended portion located on the channel region of the substrate and alighted with the floating gate with a predetermined gap An absolute value of a threshold voltage of a transistor including the stacked portion of the control gate is less than an absolute value of a threshold voltage of a transistor including the extended portion of the control gate at a time when the erase operation is completed. The program operation is performed in a condition where the absolute value of the threshold voltage of the transistor including the stacked portion of the control gate is less than the absolute value of the threshold voltage of the transistor including the extended portion of the control gate.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 1:
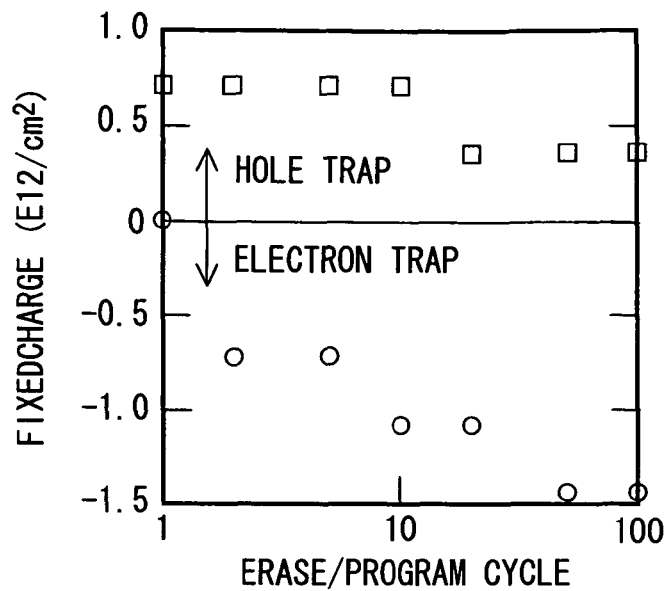
FIG. 1 is a diagram illustrating a relationship between the amount of charges in an insulating film and the number of erase and program cycles of a related art nonvolatile semiconductor memory device.

The present inventors have investigated a cause of a decrease in a programmed threshold voltage of a nonvolatile semiconductor memory device with an increase in the number of erase and program cycles. Specifically, the inventors have measured through charge pumping technique the amount of changes trapped by an insulating film interposed between a semiconductor substrate and a floating gate of a nonvolatile semiconductor memory device having a stacked gate structure. As illustrated in FIG. 1, the result of the investigation shows that the amount of electrons trapped by the insulating film increases with an increase in the number of erase and program cycles. The result of the investigation indicates that the insulating film is damaged by avalanche breakdown during an erase operation so that traps are formed in the insulating film, and electrons are caught by the traps during a program operation. As the number of erase and program cycles increases, the amount of electrons caught by the traps in the insulating film increases. As a result, a potential of the insulating film with respect to an electron increases so that the amount of electrons injected into a floating gate decreases.

As described above, the inventors have found out that the decrease in the programmed threshold voltage of the nonvolatile semiconductor memory device with the increase in the number of erase and program cycles results from an increase in the amount of electrons caught by the traps in the insulating film.

First Embodiment

Figure 2:
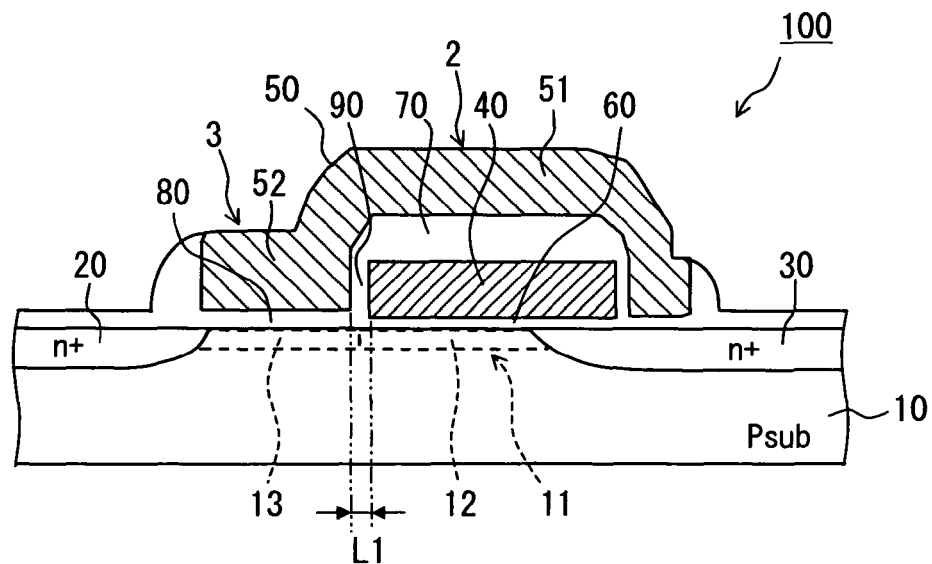
FIG. 2 is a diagram illustrating a cross-sectional view of a nonvolatile semiconductor memory device according to a first embodiment of the present invention.

As shown in FIG. 2, a nonvolatile semiconductor memory device 100 according to a first embodiment of the present invention has a split gate structure. The memory device 100 is electrically erased and programmed and includes a semiconductor substrate 10, a floating gate 40, and a control gate 50. The substrate 10 includes a source 20 and a drain 30 that are spaced apart from each other and formed near a surface of the substrate 10. A channel region 11 is formed between the source 20 and the drain 30. The channel region has a first end portion near the drain 30 and a second end portion near the source 20. The first and second end portions have the same width. The memory device 100 is electrically erased by a hot carrier generated, due to avalanche breakdown, in the first end portion of the channel region 11.

The channel region 11 has a high electric field zone. When the memory device 100 is programmed, an electric field in the channel region 11 reaches a maximum at the high electric field zone. An electron flowing through the channel region 11 from the source 20 to the drain 30 changes to a hot electron at the high electric field zone. The hot electron is injected into the floating gate 40 at the high electric field zone so that the memory device 100 can be programmed. The high electric field zone is located between the first and second end portions of the channel region 11. Thus, when the memory device 100 is programmed, the hot electron injection into the floating gate 40 does not occur in the first end portion of the channel region 11, where the hot hole is generated when the memory device 100 is erased.

The substrate 10 is a p-type. Each of the source 20 and the drain 30 is an n+-type impurity diffusion region having an impurity concentration of about $1 \times 10^{20}$ cm$^{-3}$. Therefore, each of the source 20 and the drain 30 has a conductive type opposite to that of the substrate 10.

The channel region 11 includes a first channel 12 and a second channel 13. The first channel 12 extends from the drain 30 to an end of the high electric field zone near the source 20 so that the high electric field zone is entirely located in the first channel 12. The second channel 13 is located adjacent to the first channel 12. An interface between the first and second channels 12, 13 is positioned in a region corresponding to a gap 90 between the floating gate 40 and the control gate 50. The second channel 13 has an impurity concentration greater than an impurity concentration of the first channel 12. In the present embodiment, for example, the first channel 12 has the impurity concentration of about $5 \times 10^{16}$ cm$^{-3}$, and the second channel 13 has the impurity concentration of about $1.5 \times 10^{17}$ cm$^{-3}$. The impurity concentration of the first channel 12 is greater than or equal to an impurity concentration of the substrate 10. In the present embodiment, p-type dopants are added to the first channel 12 so that the impurity concentration of the first channel 12 can be greater than the impurity concentration of the substrate 10.

In the present embodiment, the source 20 and the drain 30 are formed near the surface of the substrate 10. Alternatively, the source 20 and the drain 30 can be formed in a p-type well region that is formed on the surface of the substrate 10 and has an impurity concentration greater than that of the substrate 10.

The floating gate 40 and the control gate 50 are formed on the surface of the substrate 10. For example, each of the floating gate 40 and the control gate 50 is formed by adding an impurity to a polysilicon film. As shown in FIG. 2, the floating gate 40 is located above the channel region 11 on the drain 30 side. Specifically, the floating gate 40 is located on the first channel 12 through a first gate insulator 60. The first gate insulator 60 has a thickness of about 10 nanometer (nm) so that the floating gate 40 can affect a potential of the first channel 12. Thus, the potential of the first channel 12 changes with the amount of charges stored in the floating gate 40 so that the first channel 12 can be formed. The floating gate 40 is located to cover the drain 30 and the first end portion of the channel region 11. Thus, when the memory device 100 is erased, the hot hole generated in the first end portion of the channel region 11 is injected into the floating gate 40.

The control gate 50 is partially stacked on the floating gate 40 through an interlayer insulating film 70. The interlayer insulating film 70 electrically insulates the control gate 50 from the floating gate 40. For example, the interlayer insulating film 70 is an ONO film having a three-layer structure, in which a nitride film is sandwiched between oxide films. Specifically, the control gate 50 includes a stacked portion 51 and an extended portion 52. The stacked portion 51 is stacked on the floating gate 40 through the interlayer insulating film 70 and capacitively coupled to the floating gate 40. The stacked portion 51 is located above the first channel 12 of the channel region 11 and serves as a gate electrode of a first transistor 2. In the present embodiment, the first transistor 2 is a memory cell transistor. The extended portion 52 is located above the channel region 11 and aligned with the floating gate 40 with the gap 90. The extended portion 52 serves as a gate electrode of a second transistor 3. In the present embodiment, the second transistor 3 is a selection transistor. Specifically, the extended portion 52 is located on the second channel 13 through a second gate insulator 80. The second gate insulator 80 has a thickness greater than the thickness of the first gate insulator 60. For example, the second gate insulator 80 has the thickness of between about 20 nm and about 30 nm. The extended portion 52 allows the control gate 50 to independently control an electric current flowing through the channel region 11 near the source 20.

As described above, the memory device 100 according to the present embodiment has a split gate structure, in which the control gate 50 serves not only the gate electrode of the first transistor 2 but also the gate electrode of the second transistor 3. For example, when the floating gate 40 is electrically neutral, a threshold voltage Vt1 of the control gate 50 of the first transistor 2 is about 0.8 volts, and a threshold voltage Vt2 of the control gate 50 of the second transistor 3 is about 1 volts.

The memory device 100 can be formed by using a conventional semiconductor manufacturing process, for example, as follows. Firstly, the surface of the p-type substrate 10 is thermally oxidized to form a silicon oxide film for the first gate insulator 60. The first and second channels 12, 13 are formed by adding a p-type dopant such as boron to the channel region 11 of the substrate 10. Then, a first polysilicon film for the floating gate 40 is formed on the silicon oxide film by using a chemical vapor deposition (CVD) method. After an ONO film for the interlayer insulating film 70 is formed on the first polysilicon film, selective etching is performed so that the first gate insulator 60, the floating gate 40, and the interlayer insulating film 70 are formed. Then, the surface of the substrate 10 is thermally oxidized to form a silicon oxide film for the second gate insulator 80. Then, a second polysilicon film for the control gate 50 is formed on the silicon oxide film by using a CVD method. Then, selective etching is performed so that the second gate insulator 80 and the control gate 50 are formed. Then, the source 20 and the drain 30 are formed by adding an n-type dopant such as phosphorus to the substrate 10 by using the floating gate 40 and the control gate 50 as a mask. Thus, the memory device 100 is formed.

Figure 3A:
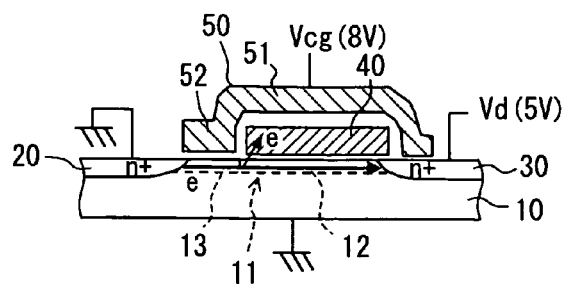
FIG. 3A is a diagram illustrating a program operation of the memory device of FIG. 1.

A program operation of the memory device 100 is described below with reference to FIG. 3A. The memory device 100 is programmed by a common channel hot electron injection (CHE) mechanism. Specifically, the source 20 is maintained at a substrate potential, a first positive potential (preferably, less than or equal to 9 volts) relative to the substrate potential is applied to the drain 30, and a second positive potential (preferably, less than or equal to 12 volts) greater than the first positive potential is applied to the control gate 50. As shown in FIG. 3A, for example, the substrate 10 and the source 20 are grounded, and the first positive potential of 5 volts is applied to the drain 30, and the second positive potential of 8 volts is applied to the control gate 50.

As described above, in the present embodiment, each of the first and second channels 12, 13 is a p-type, and the impurity concentration of the second channel 13 is greater than that of the first channel 12. Therefore, the second channel 13 is unlikely to be inverted to an n-type as compared to the first channel 12. In other words, an absolute value of the threshold voltage Vt2 of the control gate 50 of the second transistor 3 having the second channel 13 is greater than an absolute value of the threshold voltage Vt1 of the control gate 50 of the first transistor 2 having the first channel 12.

In such an approach, when the voltage applied to the control gate 50 exceeds the threshold voltage Vt1 of the first transistor 2 during the program operation of the memory device 1, the first channel 12 is inverted to an n-type so that a channel is formed. This can be considered that the drain 30 extends to the interface between the first and second channels 12, 13 of the channel region 11. Then, when the voltage applied to the control gate 50 exceeds the threshold voltage Vt2 of the second transistor 3, the second channel 13 is inverted to an n-type channel so that a channel is formed. Since the first channel 12 has been already inverted to an n-type at this time, the electromagnetic field in the channel region 11 reaches a maximum at the interface between the first and second channels 12, 13. In short, the high electric field zone in the channel region 11 is located near the interface between first and second channels 12, 13. Therefore, when an electron emitted from the source 20 flows to the drain 30 through the channel region 11 at high speed, the electron changes to the hot electron near the interface between first and second channels 12, 13. The hot electron is injected into the floating gate 40 near the interface between first and second channels 12, 13 by passing through the first gate insulator 60. As a result, the memory device 100 is programmed, i.e., data is written in the memory device 100.

If the threshold voltage Vt1 of the first transistor 2 having the first channel 12 is very low, it takes a lot of time to finish the hot electron injection into the floating gate 40 during the program operation of the memory device 100. Therefore, it is preferable that at least one of the impurity concentration of the first channel 12 and the thickness of the first gate insulator 60 should be adjusted so that the threshold voltage Vt1 can be greater than or equal to minus 4 volts.

Figure 3B:
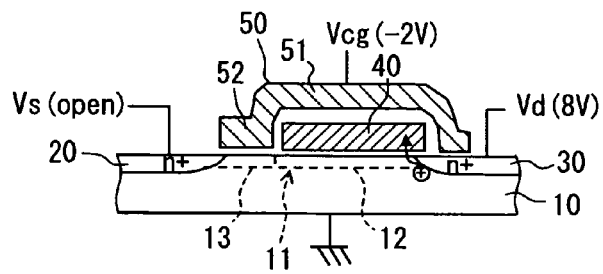
FIG. 3B is a diagram illustrating an erase operation of the memory device of FIG. 1.

Next, an erase operation of the memory device 100 is described below with reference to FIG. 3B. The memory device 100 is erased by a common hot hole injection (HH) mechanism. Specifically, the substrate potential or a negative potential with respect to the substrate potential is applied to the control gate 50, the source 20 is maintained at a floating potential, and a positive potential (e.g., from about 5 volts to about 12 volts) with respect to the substrate potential is applied to the drain 30 to cause avalanche breakdown. As shown in FIG. 3B, for example, the substrate 10 is grounded, the source 20 is open circuited, the positive potential of 8 volts is applied to the drain 30, and the negative potential of minus 2 volts is applied to the control gate 50.

When avalanche breakdown occurs between the substrate 10 and the drain 30, an avalanche current flows so that the hot hole generated in the first end portion of the channel region 11 is injected into the floating gate 40. As a result, the electron stored in the floating gate 40 is neutralized by the injected hole so that the memory device 100 is erased.

Figure 4A:
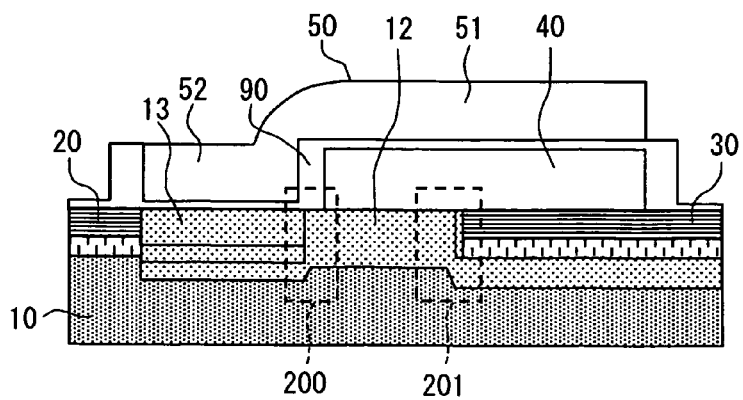
FIG. 4A is a diagram illustrating an impurity concentration distribution in the memory device of FIG. 2.
Figure 4B:
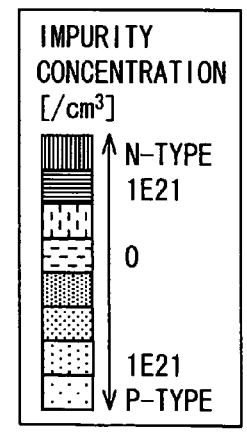
FIG. 4B is a diagram for identifying the impurity concentration distribution of FIG. 4A.
Figure 5A:
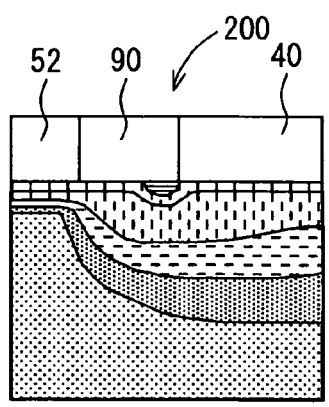
FIG. 5A is a diagram illustrating an electric field during a program operation in a region enclosed by a first rectangle of FIG. 4A.
Figure 5B:
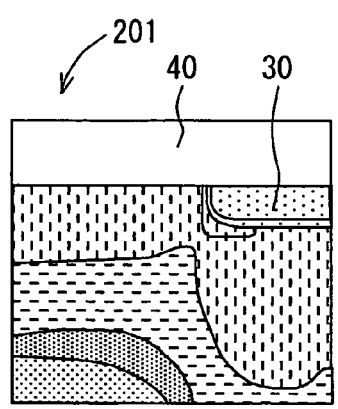
FIG. 5B is a diagram illustrating the electric field during the program operation in a region enclosed by a second rectangle of FIG. 4A.
Figure 5C:
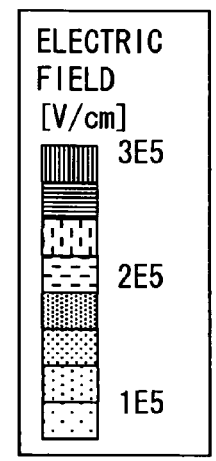
FIG. 5C is a diagram for identifying the electric field of FIGS. 5A, 5B.
Figure 6A:
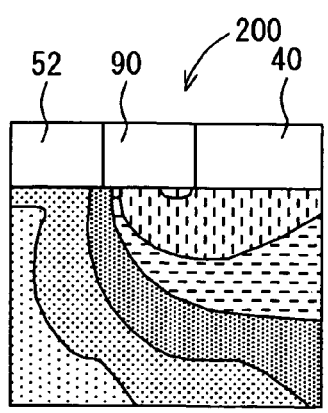
FIG. 6A is a diagram illustrating an electric field during an erase operation in the region enclosed by the first rectangle of FIG. 4A.
Figure 6B:
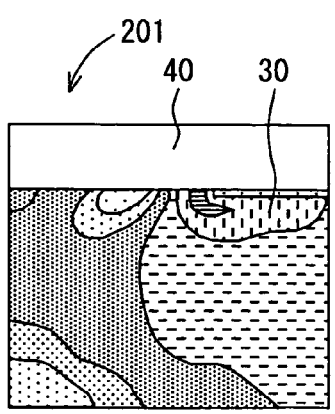
FIG. 6B is a diagram illustrating the electric field during the erase operation in the region enclosed by the second rectangle of FIG. 4A.
Figure 6C:
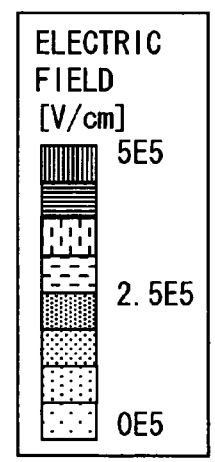
FIG. 6C is a diagram for identifying the electric field of FIGS. 6A, 6B.
Figure 7:
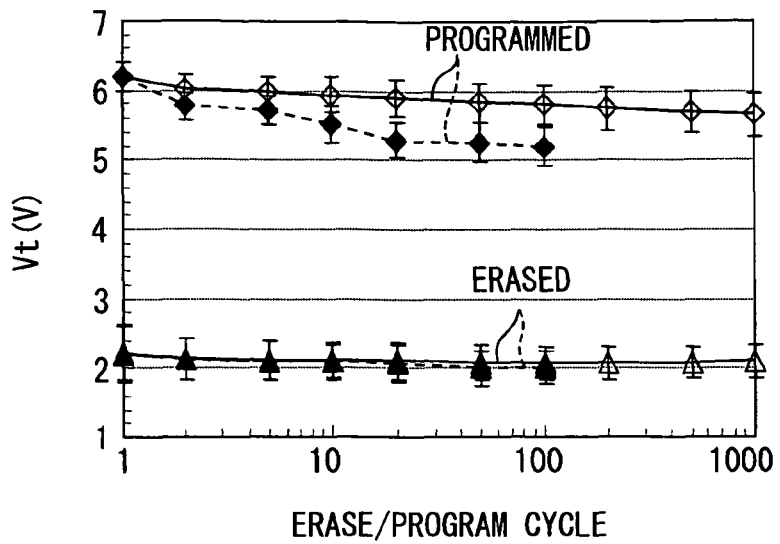
FIG. 7 is a diagram illustrating a relationship between a threshold voltage and the number of erase and program cycles of the memory device of FIG. 2.

The present inventors have evaluated effects of the memory device 100 by both simulation and actual measurement. FIGS. 4A-6C show a result of the simulation, and FIG. 7 shows a result of the actual measurement. FIG. 4A shows an impurity concentration distribution in the substrate 10. The concentration of FIG. 4A is indicated by FIG. 4B. FIGS. 5A, 5B show an electric field distribution in the substrate 10 appearing when the memory device 100 is programmed. Specifically, FIG. 5A shows the electric field distribution in a region enclosed by a first rectangle 200 of FIG. 4A, and FIG. 5B shows the electric field distribution in a region enclosed by a second rectangle 201 of FIG. 4A. The electric fields in FIGS. 5A, 5B are indicated by FIG. 5C. FIGS. 6A, 6B show an electric field distribution in the substrate 10 appearing when the memory device 100 is erased. Specifically, FIG. 6A shows the electric field distribution in the region enclosed by the first rectangle 200 of FIG. 4A, and FIG. 6B shows the electric field distribution in the region enclosed by the second rectangle 201 of FIG. 4A. The electric fields in FIGS. 6A, 6B are indicated by FIG. 6C.

As shown in FIGS. 4A, 4B, the impurity concentration of the second channel 13 is greater than the impurity concentration of the first channel 12. As can be seen from FIGS. 5A, 5B, the electric field is high the interface between the first and second channels 12, 13, when the memory device 100 is programmed. As can be seen from FIGS. 6A, 6B, the electric field is high near the drain 30, when the memory device 100 is erased. Therefore, the result of the simulation indicates that the hot electron injection into the floating gate 40 during the program operation occurs near the interface between the first and second channels 12, 13, and the hot hole injection into the floating gate 40 during the erase operation occurs near the drain 30.

FIG. 7 shows the result of the actual measurement conducted to determine a relationship between a threshold voltage Vt and the number of erase and program cycles. In FIG. 7, solids line represent the memory device 100, in which the hot electron injection and the hot hole injection arise at a different position, and broken lines represent a conventional nonvolatile semiconductor memory device, in which the hot electron injection and the hot hole injection arise at a same position. In the actual measurement, five threshold data has been obtained per each erase and program cycle at a temperature of 25 degrees Celsius (° C.). As can be seen from FIG. 7, the decrease in a programmed threshold voltage of the memory device 100 is smaller than that of the conventional memory device. In FIG. 7, the programmed Vt represents a threshold voltage appearing after the memory device is programmed, and an erased Vt represents a threshold voltage appearing after the memory device is erased.

As described above, the memory device 100 according to the first embodiment of the present invention has a split gate structure and can be electrically erased by a hot carrier (i.e., a hot hole) generated in the first end portion of the channel region 11 near the drain 30. The channel region 11 includes the first channel 12 and the second channel 13. The first channel 12 extends from the drain 30, and the second channel 13 is located adjacent to the first channel 12 and extends to the source 20. The impurity concentration of the second channel 13 is greater than that of the first channel 12. The high electric field zone, i.e., the interface between the first and second channels 12, 13 is located between the first and second end portions of the channel region 11. Therefore, the interface between the first and second channels 12, 13 is located outside the first end portion, where the hot hole is generated during the erase operation of the memory device 100.

In such an approach, when the memory device 100 is programmed, the electrons flowing through the channel region 11 from the source 20 to the drain 30 change to the hot electrons at the interface between the first and second channels 12, 13. Thus, an electron injection position, where the hot electron is injected into the floating gate 40 through the first gate insulator 60 during the program operation, can be different from a hole injection position, where the hot hole is injected into the floating gate 40 through the first gate insulator 60 during the erase operation. Therefore, the amount of electrons trapped by the first gate insulator 60 during the program operation decreases. As a result, even after a number of programming and erasing operations times of the memory device 100, a decrease in the programmed threshold voltage can be reduced. In other words, even after the memory device 100 is repeatedly erased and programmed a number of times, the programmed threshold voltage returns to a predetermined value in a short time.

Further, according to the first embodiment, the interface between the first and second channels 12, 13 is positioned in the region corresponding to the gap 90 between the floating gate 40 and the extended portion 52 of the control gate 50. The region corresponding to the gap 90 serves as resistance, when a channel is formed in the channel region 11. Therefore, the electric field in the channel region 11 is likely to become high near the interface between the first and second channels 12, 13. This structure allows the substrate potential or the negative potential with respect to the substrate potential to be applied to the control gate 50 during the erase operation of the memory device 100. In this case, the amount of electrons stored in the floating gate 40 is small so that the erase operation can be completed in a shorter time.

Furthermore, according to the first embodiment, the electron injection position, where the hot electron is injected into the floating gate 40 through the first gate insulator 60 during the program operation, can be controlled by adjusting the impurity concentration of the first and second channels 12, 13 of the channel region 11. Therefore, the memory device 100 can be simplified in structure.

The present inventors have confirmed through simulation that the decrease in the programmed threshold voltage can be efficiently reduced when a distance between the high electric field zone and the first end portion of the channel region 11 is greater than or equal to 0.06 μm. Therefore, it is preferable that the distance between the high electric field zone and the first end portion of the channel region 11 is greater than or equal to 0.06 μm.

Figure 8:
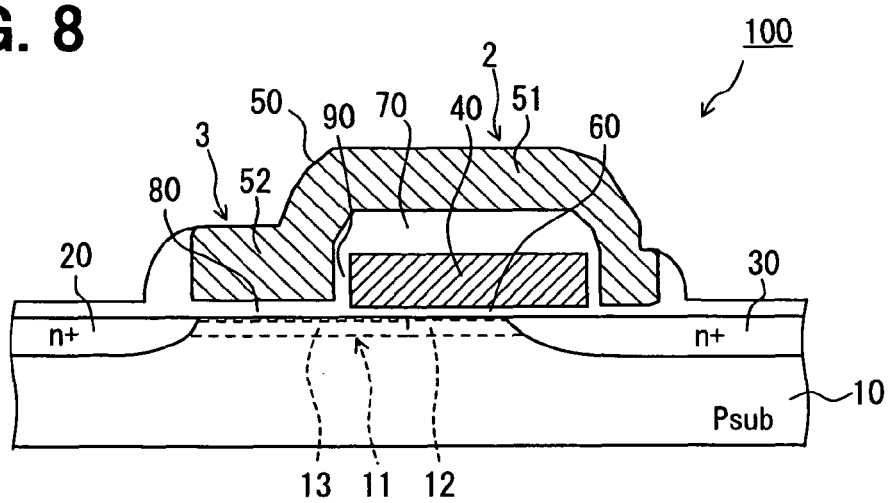
FIG. 8 is a diagram illustrating a cross-sectional view of a nonvolatile semiconductor memory device according to a first modification of the memory device of FIG. 2.

Alternatively, the interface between the first and second channels 12, 13 can be positioned in a region other than the region corresponding to the gap 90 between the floating gate 40 and the extended portion 52 of the control gate 50. For example, as shown in FIG. 8, the interface between the first and second channels 12, 13 can be positioned in a region directly below the floating gate 40.

Figure 9:
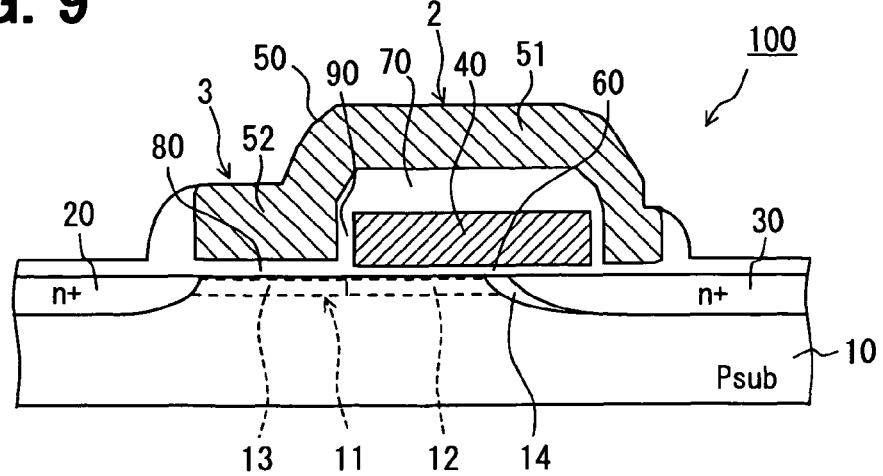
FIG. 9 is a diagram illustrating a cross-sectional view of a nonvolatile semiconductor memory device according to a second modification of the memory device of FIG. 2.

Alternatively, the drain 30 is provided with a p-type high concentration region 14. For example, the highly concentration region 14 has an impurity concentration of about $1 \times 10^{18}$ cm$^{-3}$. In such an approach, the avalanche breakdown easily occurs between the drain 30 and the substrate 10 so that the hot hole can be injected into the floating gate 40 at low voltage during the erase operation of the memory device 100. Thus, the memory device 100 can be driven at low voltage. In the case of FIG. 9, the high concentration region 14 is added to the drain 30 only near the surface of the substrate 10. Alternatively, the high concentration region 14 can be added to cover the drain 30. Further, the source 20 can be provided with the concentration region 14.

In the present embodiment, the control gate 50 is maintained at the substrate potential or the negative potential with respect to the substrate potential. Alternatively, the control gate 50 can be maintained at a positive potential with respect to the substrate potential. In this case, the erase operation of the memory device 100 is completed in a longer time, because the positive potential makes the hot hole injection into the floating gate 40 difficult.

In the present embodiment, the memory device 100 employs an n-channel structure. Alternatively, the memory device 100 can employ a p-channel structure. In the case of the p-type structure, like the n-type structure, an absolute value of the threshold voltage Vt2 of the control gate 50 of the second transistor 3 having the second channel 13 is set greater than an absolute value of the threshold voltage Vt1 of the control gate 50 of the first transistor 2 having the first channel 12. Specifically, the impurity concentration of the second channel 13 is set greater than that of the first channel 12 so that the second channel 13 can be unlikely to be inverted to a p-type as compared to the first channel 12.

Second Embodiment

A nonvolatile semiconductor memory device 101 according to a second embodiment of the present invention is described below with reference to FIG. 10. Differences between the first and second embodiments are as follows. In the memory device 101 according to the second embodiment, the channel region 11 includes a third channel 15 in addition to the first and second channels 12, 13. The first channel 12 extends from the drain 30, the third channel 15 extends from the source 20, and the second channel 13 is located between the first and third channels 12, 15.

Like the first embodiment, the impurity concentration of the second channel 13 is set higher than that of the first channel 12. Thus, the absolute value of the threshold voltage Vt2 of the control gate 50 of the second transistor 3 having the second channel 13 is higher than the absolute value of the threshold voltage Vt1 of the control gate 50 of the first transistor 2 having the first channel 12. Further, the impurity concentration of the second channel 13 is set higher than that of the third channel 15. Thus, the absolute value of the threshold voltage Vt2 of the control gate 50 of the second transistor 3 having the second channel 13 is higher than an absolute value of a threshold voltage Vt3 of the control gate 50 of a third transistor 4 having the third channel 15. In such an approach, the electric field in the channel region 11 reaches a maximum at a first interface between the first and second channels 12, 13. Therefore, the high electric field zone in the channel region 11 is located near the first interface between first and second channels 12, 13. The impurity concentration of the third channel 15 can be the same as or different from that of the first channel 12. In the present embodiment, the impurity concentration of the third channel 15 is set the same as that of the first channel 12.

Figure 10:
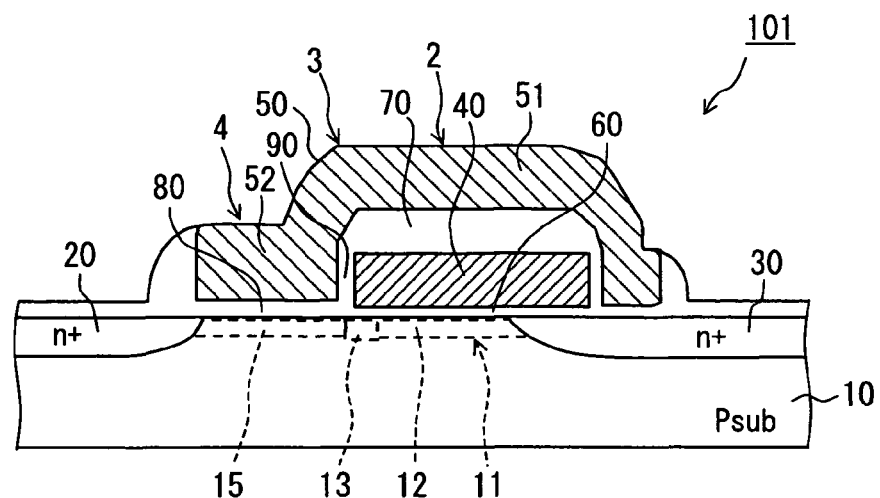
FIG. 10 is a diagram illustrating a cross-sectional view of a nonvolatile semiconductor memory device according to a second embodiment of the present invention.

In the case of FIG. 10, the first interface between the first and second channels 12, 13 is positioned in a region directly below the floating gate 40, and a second interface between the second and third channels 13, 15 is positioned in a region directly below the gap 90 between the floating gate 40 and the extended portion 52 of the control gate 50. Alternatively, the first interface between the first and second channels 12, 13 can be positioned in a region other than the region directly below the floating gate 40, and the second interface between the second and third channels 13, 15 can be positioned in a region other than the region directly below the gap 90. Like the first embodiment, the memory device 101 can employ a p-channel structure and can have the high concentration region 14 shown in FIG. 9.

Third Embodiment

A nonvolatile semiconductor memory device 102 according to a third embodiment of the present invention is described below with reference to FIG. 11. Differences between the first and third embodiments are as follows. In the memory device 102 according to the third embodiment, the thickness of the substrate 10 is greater at the second transistor 3 than at the first transistor 2 so that the surface of the substrate 10 has a slope 16. A height L2 of the slope 16 is greater than a thickness L3 of a channel (i.e., n-type inversion layer) formed in the second channel 13.

When the memory device 102 is programmed, the electron flowing through the channel region 11 from the source 20 to the drain 30 changes to the hot electron at the interface between the first and second channels 12, 13. As shown in FIG. 11, since the slope 16 is positioned at the interface, the hot electron can be straightly injected into the floating gate 40 without changing direction of movement as shown in FIG. 11. As a result, the program operation of the memory device 102 can be completed in a shorter time. Further, the lowering in the programmed threshold voltage can be reduced.

As described above, according to the third embodiment, the height L2 of the slope 16 is set greater than the thickness L3 of the channel (i.e., n-type inversion layer) formed in the second channel 13. Alternatively, the height L2 of the slope 16 can be set less than or equal to the thickness L3 of the channel formed in the second channel 13, as long as the height L2 of the slope 16 is greater than zero. As the height L2 of the slope 16 is larger, the hot electron can be efficiently injected into the floating gate 40. However, as the height L2 is larger, it is difficult to form elements (e.g., control gate 50) formed on the surface of the substrate 10. Therefore, it is preferable that the height L2 should be less than or equal to 0.2 μm. It is more preferable that the height L2 should be about 0.06 μm. The modifications of the first embodiment shown in FIGS. 8, 9 and the second embodiment shown in FIG. 10 can employ the slope 16.

Fourth Embodiment

A nonvolatile semiconductor memory device 103 according to a fourth embodiment of the present invention is described below with reference to FIGS. 12A and 12B. Differences between the first and fourth embodiments are as follows. In the first embodiment, the channel region 11 is divided into two portions, each of which has a different impurity concentration. In contrast, in the fourth embodiment, the channel region 11 is not divided. Specifically, the fourth embodiment relates to a method of erasing and programming a nonvolatile semiconductor memory device having a channel region 11 with a constant impurity concentration.

Like the memory device 100 according to the first embodiment, the memory device 103 includes a control gate 50 having a stacked portion 51 and an extended portion 52. The stacked portion 51 is stacked on a floating gate 40 and capacitively coupled to the floating gate 40. The stacked portion 51 serves as a gate electrode of a first transistor 2. The extended portion 52 is located above the channel region 11 and aligned with the floating gate 40 with a gap. The extended portion 52 serves as a gate electrode of a second transistor 3. For example, an absolute value of a threshold voltage Vt1 of the first transistor 2 can be greater than an absolute value of a threshold voltage Vt2 of the second transistor 3 by injecting a lot of hot holes into the floating gate 40 during an erase operation of the memory device 103. Thus, the memory device 103 can have the same effect as the memory device 100 has.

Figure 12A:
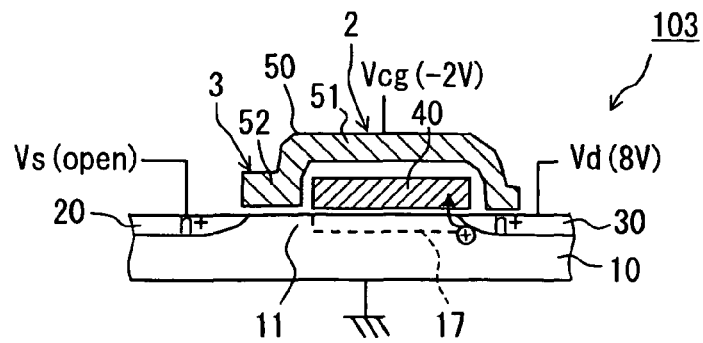
FIG. 12A is a diagram illustrating a cross-sectional view of a nonvolatile semiconductor memory device according to a fourth embodiment of the present invention during an erase operation.

In the present embodiment, as shown in FIG. 12A, when the memory device 103 is erased, a substrate potential or a negative potential with respect to the substrate potential is applied to the control gate 50. For example, a substrate 10 is grounded, a source 20 is open circuited, a positive potential of 8 volts is applied to a drain 30, and the negative potential of minus 2 volts is applied to the control gate 50.

When the control gate 50 is maintained at the substrate potential or the negative potential with respect to the substrate potential, the amount of electrons stored in the floating gate 40 becomes smaller. As shown in FIG. 12A, a portion in the channel region 11 directly below the floating gate 40 is inverted to an n-type so that an inversion layer 17 is selectively formed in the channel region 11 at a time when the erase operation is completed. In other words, the channel region 11 is partially depleted. Since the inversion layer 17 is not formed in the channel region 11 at a time when the erase operation is started, the hot hole can be injected into the floating gate 40 near the drain 30.

Figure 12B:
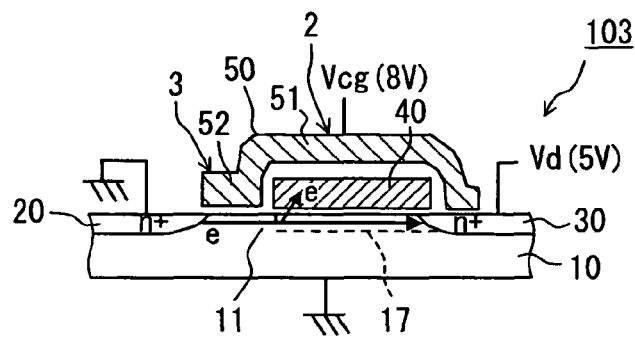
FIG. 12B is a diagram illustrating a cross-sectional view of the memory device according to the fourth embodiment during a program operation.

Therefore, as shown in FIG. 12B, an electric field in the channel region 11 reaches a maximum at an end portion of the inversion layer 17 near the source 20 at a time when the memory device 103 switches to a program operation. In short, a high electric field zone is located at the end portion of the inversion layer 17 near the source 20. As a result, an electron flowing through the channel region 11 from the source 20 to the drain 30 changes to a hot electron at the end portion of the inversion layer 17 near the source 20. Although the inversion layer 17 disappears with time, the hot electron can be easily injected into the floating gate 40 immediately after the memory device 103 switches to the program operation. This is because the amount of electrons stored in the floating gate 40 is smaller immediately after the memory device 103 switches to the program operation. In the present embodiment, when the memory device 103 is programmed, the substrate 10 and the source 20 are grounded, a positive potential of 5 volts is applied to the drain 30, and a positive potential of 8 volts is applied to the control gate 50.

As described above, according to the fourth embodiment, an electron injection position, where the hot electron is injected into the floating gate 40 through a first gate insulator 60 during the program operation, can be different from a hole injection position, where the hot hole is injected into the floating gate 40 through the first gate insulator 60 during the erase operation. Therefore, the amount of electrons trapped by the first gate insulator 60 during the program operation decreases. As a result, even after the memory device 103 is repeatedly erased and programmed a number of times, the decrease in a programmed threshold voltage can be reduced.

The control gate 50 is maintained at the substrate potential or the negative potential with respect to the substrate potential during the erase operation. In such an approach, the erase operation can be completed in a short time, as compared to when the control gate 50 is maintained at a positive potential with respect to the substrate during the erase operation. The inversion layer 17 is selectively formed in the channel region 11 directly below the floating gate 40 by controlling the charge (i.e., the amount of electrons) in the floating gate 40 before the program operation is started. The inversion layer 17 can be considered as the first channel 12 by aligning an end of the floating gate 40 near the source 20 to the interface between the first and second channels 12, 13 in the first embodiment. The memory device 103 employs an n-channel structure. Alternatively, the memory device 103 can employ an p-channel structure.

Fifth Embodiment

A nonvolatile semiconductor memory device 104 according to a fifth embodiment of the present invention is described below with reference to FIG. 13. Differences between the first embodiment and the fifth embodiment are as follows. In the first embodiment, the control gate 50 includes the extended portion 52. In contrast, in the fifth embodiment, a control gate 50 does not have the extended portion 52. In short, while the memory device 100 according to the first embodiment has a split gate structure, the memory device 104 according to the fifth embodiment has a stacked gate structure.

The memory device 104 has the same structure as the memory device 100 shown in FIG. 2, except that the control gate 50 is entirely disposed on a substrate 10 through a floating gate 40. Specifically, the substrate 10 is a p-type and includes a source 20 and a drain 30. The source 20 and the drain 30 are spaced apart from each other and formed near a surface of the substrate 10. Each of the source 20 and the drain 30 is an n+-type impurity diffusion region. A channel region 11 is formed between the source 20 and the drain 30. The floating gate 40 is stacked on the surface of the substrate 10 through a first gate insulator 60 and located above the channel region 11. The control gate 50 is entirely stacked on the floating gate 40 through an interlayer insulating film 70. Thus, the memory device 104 has a stacked gate structure.

The channel region 11 includes a first channel 12 and a second channel 13. The first channel 12 extends from the drain 30, and the second channel 13 is located adjacent to the first channel 12 and extends to the source 20. An interface between the first and second channels 12, 13 is located between the first and second end portions of the channel region 11. The second channel 13 has an impurity concentration higher than an impurity concentration of the first channel 12, so that an absolute value of a threshold voltage Vt2 of a second transistor 3 is higher than an absolute value of a threshold voltage Vt1 of a first transistor 2.

Thus, when the memory device 104 is programmed, an electric field in the channel region 11 reaches a maximum near the interface between the first and second end portions of the channel region 11. As a result, an electron injection position, where the hot electron is injected into the floating gate 40 through the first gate insulator 60 during the program operation, can be different from a hole injection position, where the hot hole is injected into the floating gate 40 through the first gate insulator 60 during the erase operation. Therefore, the amount of electrons trapped by the first gate insulator 60 during the program operation decreases. As a result, even after the memory device 104 is repeatedly erased and programmed a number of times, the lowering in a programmed threshold voltage can be reduced. In other words, even after the memory device 104 is repeatedly erased and programmed a number of times, the programmed threshold returns to a predetermined value in a short time.

Figure 11:
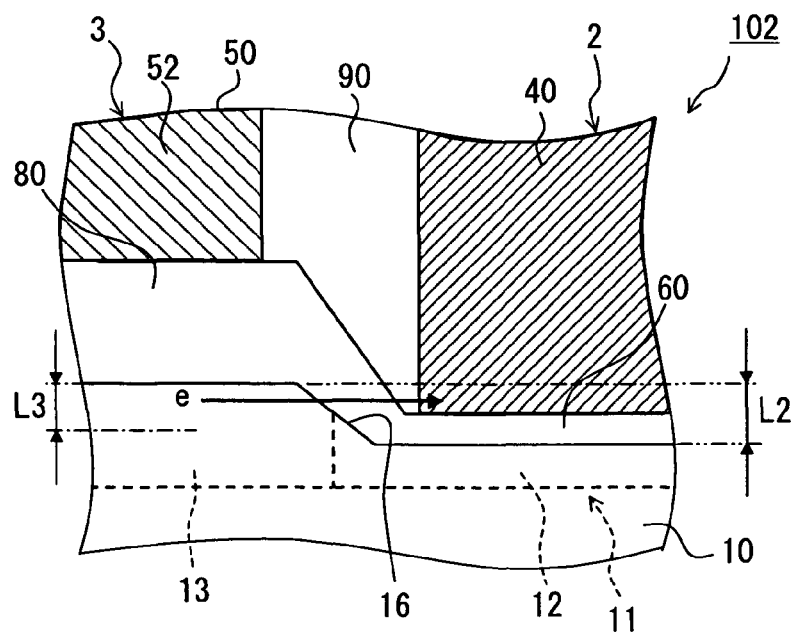
FIG. 11 is a diagram illustrating a cross-sectional view of a nonvolatile semiconductor memory device according to a third embodiment of the present invention.

The modifications of the first embodiment shown in FIGS. 8, 9, the second embodiment shown in FIG. 10, and the third embodiment shown in FIG. 11 can employ the structure according to the fifth embodiment.

Sixth Embodiment

A nonvolatile semiconductor memory device 105 according to a sixth embodiment of the present invention is described below with reference to FIG. 14. Differences between the fifth embodiment and the sixth embodiment are as follows.

In the fifth embodiment, the second channel 13 has the impurity concentration greater than that of the first channel 12 so that the absolute value of the threshold voltage Vt2 of the second transistor 3 is higher than the absolute value of the threshold voltage Vt1 of the first transistor 2. In contrast, in the sixth embodiment, a second channel 13 of a channel region 11 has an impurity concentration equal to that of a first channel 12 of the channel region 11. Thus, the channel region 11 has a constant impurity concentration. An absolute value of a threshold voltage Vt2 of a second transistor 3 is set higher than an absolute value of a threshold voltage Vt1 of a first transistor 2 by adjusting a thickness of an insulating layer interposed between a substrate 10 and a floating gate 40.

Figure 14:
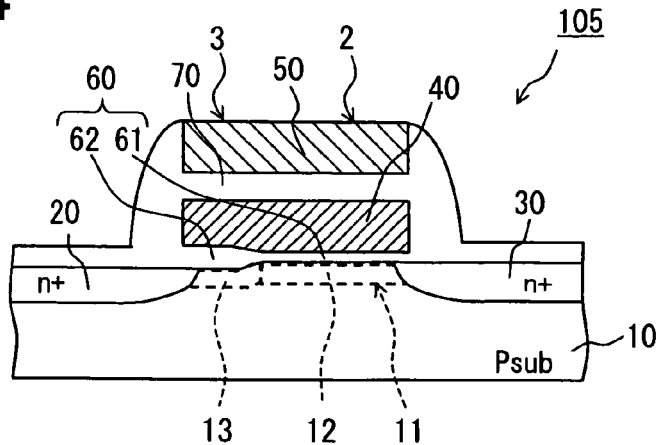
FIG. 14 is a diagram illustrating a cross-sectional view of a nonvolatile semiconductor memory device according to a sixth embodiment of the present invention.

For example, as shown in FIG. 14, a first gate insulator 60 interposed between the substrate 10 and the floating gate 40 has a first portion 61 and a second portion 62. The first portion 61 is located on the first channel 12, and the second portion 62 is located on the second channel 13. A thickness of the second portion 62 is higher than a thickness of the first portion 61.

As the thickness of the first gate insulator 60 interposed between the substrate 10 and the floating gate 40 is higher, an electric field in the channel region 11 decreases, and an inversion layer is less likely to be formed in the channel region 11. In the present embodiment, since the thickness of the second portion 62 located on the second channel 13 is greater than the thickness of the first portion 61 located on the first channel 12, the second channel 13 is less likely to be inverted to an n-type as compared to the first channel 12. As a result, when the floating gate 40 is electrically neutral, the absolute value of the threshold voltage Vt2 of the second transistor 3 becomes higher than the absolute value of the threshold voltage Vt1 of the first transistor 2. Therefore, when the memory device 105 is programmed, an electric field in the channel region 11 reaches a maximum at an interface between the first and second channels 12, 13. Thus, an electron injection position, where a hot electron is injected into the floating gate 40 through the first gate insulator 60 during a program operation, can be different from a hole injection position, where a hot hole is injected into the floating gate 40 through the first gate insulator 60 during an erase operation. Therefore, the amount of electrons trapped by the first gate insulator 60 during the program operation decreases. As a result, even after the memory device 105 is repeatedly erased and programmed a number of times, a decrease in a programmed threshold voltage can be reduced. In other words, even after the memory device 105 is repeatedly erased and programmed a number of times, the programmed threshold voltage returns to a predetermined value in a short time.

The first embodiment shown in FIG. 2, the modifications of the first embodiment shown in FIGS. 8, 9, the second embodiment shown in FIG. 10, and the third embodiment shown in FIG. 11 can employ the structure according to the sixth embodiment. For example, the absolute value of the threshold voltage Vt2 of the second transistor 3 can be set higher than the absolute value of the threshold voltage Vt1 of the first transistor 2 by adjusting both the thickness of the first gate insulator 60 and the impurity concentration of the channel region 11.

Figure 15:
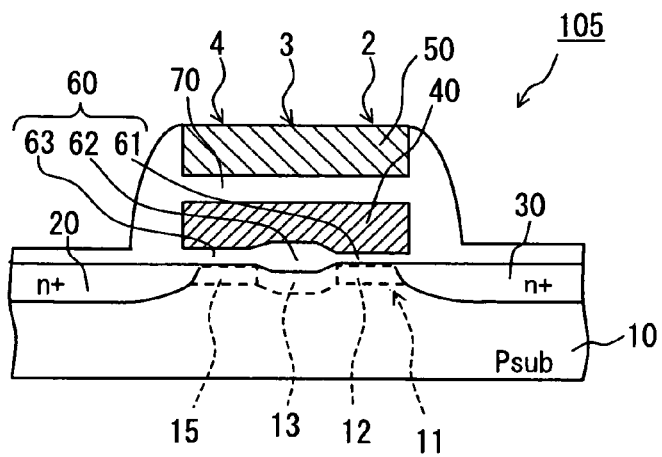
FIG. 15 is a diagram illustrating a cross-sectional view of a nonvolatile semiconductor memory device according to a modification of the sixth embodiment.

A modification of the sixth embodiment is described below with reference to FIG. 15. In the case of FIG. 15, the channel region 11 includes a third channel 15 in addition to the first and second channels 12, 13. The first channel 12 extends from the drain 30, the third channel 15 extends from the source 20, and the second channel 13 is sandwiched between the first and third channels 12, 15. Further, the first gate insulator 60 has a third portion 63 in addition to the first and second portions 61, 62. The first portion 61 is located on the first channel 12, the second portion 62 is located on the second channel 13, and the third portion 63 is located on the third channel 15. A thickness of the third portion 63 is higher than a thickness of the first portion 61, and a thickness of the second portion 62 is higher than the thickness of the third portion 63. In such an approach, an absolute value of a threshold voltage Vt2 of a second transistor 3 becomes higher than each of absolute values of threshold voltages Vt1, Vt3 of first and third transistors 2, 4. Therefore, the second channel 13 is less likely to be inverted to an n-type, as compared to the first and third channels 12, 15. Alternatively, the thickness of the third portion 63 can be equal to the thickness of the first portion 61.

Seventh Embodiment

A nonvolatile semiconductor memory device 106 according to a seventh embodiment of the present invention is described below with reference to FIG. 16. Differences between the fifth embodiment shown in FIG. 13 and the seventh embodiment are as follows.

In the fifth embodiment, the absolute value of the threshold voltage Vt2 of the second transistor 3 is set higher than the absolute value of the threshold voltage Vt1 of the first transistor 2 by setting the impurity concentration of the second channel 13 greater than that of the first channel 12. In contrast, in the seventh embodiment, an absolute value of a threshold voltage Vt2 of a second transistor 3 is set higher than an absolute value of a threshold voltage Vt1 of a first transistor 2 by using a floating gate 40 having portions, each of which is made of material having a different work function.

Figure 16:
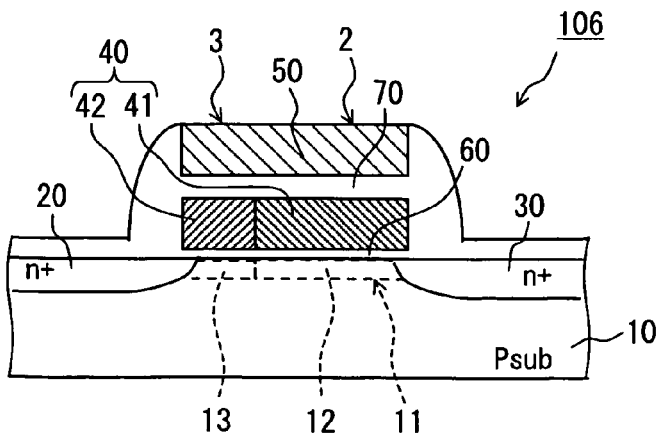
FIG. 16 is a diagram illustrating a cross-sectional view of a nonvolatile semiconductor memory device according to a seventh embodiment of the present invention.

As shown in FIG. 16, like the fifth embodiment, a channel region 11 includes a first channel 12 and a second channel 13. Unlike the fifth embodiment, an impurity concentration of the first channel 12 is set approximately equal to than of the second channel 13. In short, the channel region 11 has an approximately constant impurity concentration. A thickness of a first gate insulator 60 interposed between the floating gate 40 and a substrate 10 is approximately constant over the channel region 11. The floating gate 40 includes a first portion 41 and a second portion 42. The first portion 41 is stacked on the first channel 12 through the first gate insulator 60, and the second portion 42 is stacked on the second channel 13 through the first gate insulator 60. The first and second portions 41, 42 of the floating gate 40 are made of materials having different work functions.

Specifically, the first portion 41 is made of a material having a work function $\phi 1$, and the second portion 42 is made of a material having a work function $\phi 2$ greater than the work function φ1. In the present embodiment, for example, the first portion 41 is made of aluminum, and the second portion 42 is made of p+ polycrystalline silicon.

Figure 17A:
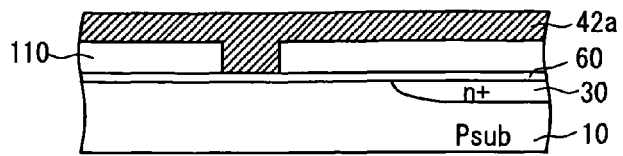
FIGS. 17A-17F are diagrams illustrating a method of manufacturing the memory device of FIG. 16.
Figure 17B:
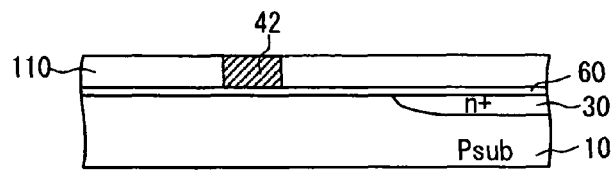

A method of manufacturing the memory device 106 is described below with reference to FIGS. 17A-17F Firstly, as shown in FIG. 17A, a substrate 10 having a drain 30 is prepared. A mask 110 made of silicon oxide is formed on a surface of the substrate 10 through a first gate insulator 60 by conventional photolithography. The mask 110 has an opening corresponding to a second channel 13. A p+ polycrystalline silicon layer 42a is formed on the surface of the substrate 10 by using the mask 110. The p+ polycrystalline silicon layer 42a on the mask 110 is removed, for example, by polishing the p+ polycrystalline silicon layer 42a until the mask 110 is exposed. Thus, as shown in FIG. 17B, a second portion 42 of a floating gate 40 is formed.

Figure 17C:
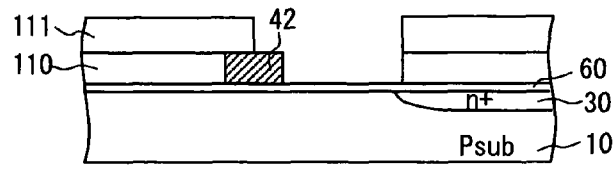
Figure 17D:
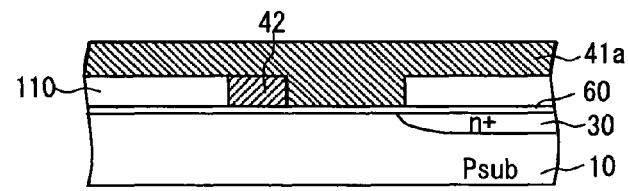
Figure 17E:
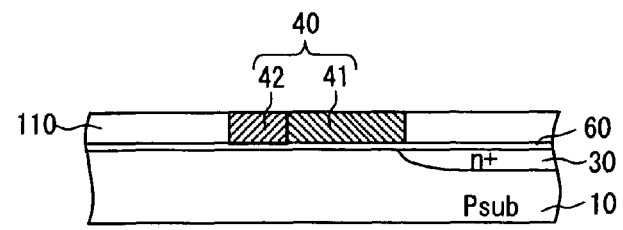
Figure 17F:
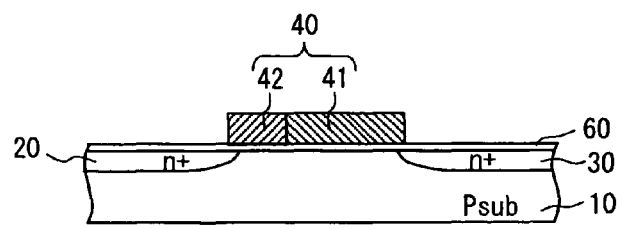

Then, as shown in FIG. 17C, a resist 111 is formed on the mask 110 and the second portion 42 by conventional photolithography. The resist 111 has an opening corresponding to a first channel 12. The mask 110 is selectively etched by using the resist 111. Then, the resist 111 is removed. Then, as shown in FIG. 17D, an aluminum layer 41a is formed on the surface of the substrate 10 by using the mask 110. The aluminum layer 41a on the mask 110 and the second portion 42 is removed, for example, by polishing the aluminum layer 41a until the mask 110 and the second portion 42 are exposed. Thus, as shown in FIG. 17E, a first portion 41 of the floating gate 40 is formed. Then, as shown in FIG. 17F, the mask 110 is removed, and a source 20 is formed in the substrate 10. Then, an interlayer insulating film 70 and a control gate 50 are formed by conventional semiconductor manufacturing process so that the memory device 106 is completed.

As is well known, when the thickness of the first gate insulators 60 is constant, a threshold voltage of a MOS structure depends on a difference in work function between the substrate 10 and the floating gate 40, a charge of the first gate insulator 60, and a threshold voltage of an interface between the first gate insulator 60 and the substrate 10. In the present embodiment, the charge of the first gate insulator 60, and the threshold voltage of the interface between the first gate insulator 60 and the substrate 10 are maintained constant. Therefore, the threshold voltage of the MOS structure depends on the difference in work function between the substrate 10 and the floating gate 40. The work function is the energy difference between a vacuum level and a Fermi level and an energy necessary to eject an electron from a surface of a metal. When the substrate 10 has an n-channel structure, and a work function of the substrate 10 is constant, a hot electron in a high-energy state is less likely to be injected into the floating gate 40 as a work function of the floating gate 40 is greater. In short, as the work function of the floating gate 40 is greater, an absolute value of the threshold voltage becomes larger.

As described above, according to the seventh embodiment, the floating gate 40 includes the first and second portions 41, 42. The first portion 41 is located on the first channel 12 and made of the material having the work function φ1, and the second portion 42 is located on the second channel 13 and made of the material having the work function φ2 greater than the work function φ1. In such an approach, when the floating gate 40 is electrically neutral, the absolute value of the threshold voltage Vt2 of the second transistor 3 becomes greater than the absolute value of the threshold voltage Vt1 of the first transistor 2. Therefore, when the memory device 106 is programmed, the electric field in the channel region 11 reaches a maximum at the interface between the first and second channels 12, 13. Thus, an electron injection position, where a hot electron is injected into the floating gate 40 through the first gate insulator 60 during a program operation, can be different from a hole injection position, where a hot hole is injected into the floating gate 40 through the first gate insulator 60 during an erase operation. Therefore, the amount of electrons trapped by the first gate insulator 60 during the program operation decreases. As a result, even after the memory device 106 is repeatedly erased and programmed a number of times, a decrease in a programmed threshold voltage can be reduced. In other words, even after the memory device 106 is repeatedly erased and programmed a number of times, the programmed threshold voltage returns to a predetermined value in a short time.

Figure 18:
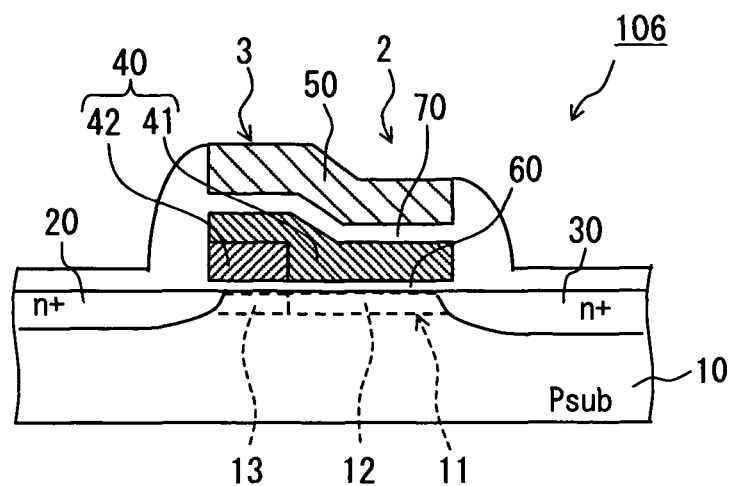
FIG. 18 is a diagram illustrating a cross-sectional view of a nonvolatile semiconductor memory device according to a first modification of the memory device of FIG. 16.

According to the seventh embodiment, as shown in FIG. 16, the first portion 41 is arranged adjacent to the second portion 42 and in contact with the second portion 42 at a side surface. Alternatively, as shown in FIG. 18, the first portion 41 can be partially stacked on the second portion 42 and in contact with the second portion 42 at side and bottom surfaces. The stacked structure of the first and second portions 41, 42 of the floating gate 40 can be achieved by conventional process such as photolithography. Alternatively, the second portion 42 can be partially stacked on the first portion 41 and in contact with the first portion 41 at side and bottom surfaces.

Figure 13:
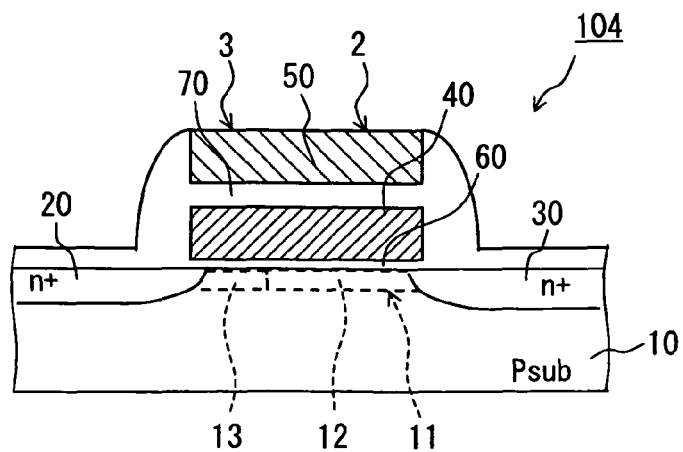
FIG. 13 is a diagram illustrating a cross-sectional view of a nonvolatile semiconductor memory device according to a fifth embodiment of the present invention.
Figure 19:
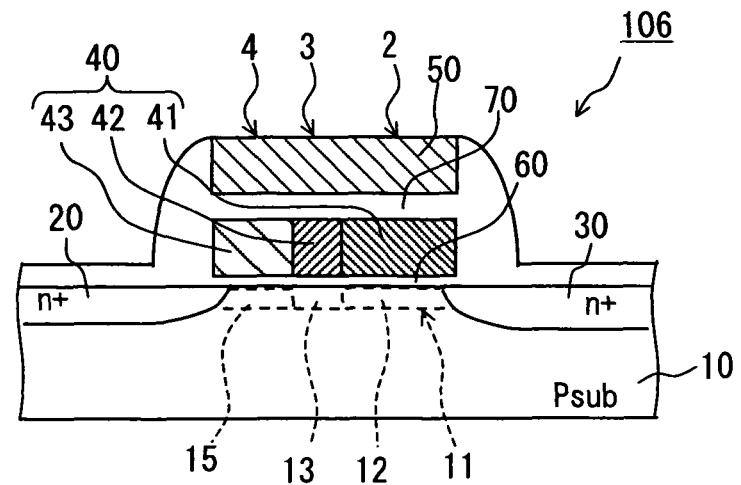
FIG. 19 is a diagram illustrating a cross-sectional view of a nonvolatile semiconductor memory device according to a second modification of the memory device of FIG. 16.

The first embodiment shown in FIG. 2, the modifications of the first embodiment shown in FIGS. 8, 9, the second embodiment shown in FIG. 10, the third embodiment shown in FIG. 11, the fifth embodiment shown in FIG. 13, and the sixth embodiment shown in FIG. 14 can employ the structure according to the seventh embodiment. For example, in the case of FIG. 19, the channel region 11 includes a third channel 15 in addition to the first and second channels 12, 13. The first channel 12 extends from the drain 30, the third channel 15 extends from the source 20, and the second channel 13 is located between the first and third channels 12, 15. Further, the floating gate 40 includes a third portion 43 in addition to the first and second portions 41, 42. The first portion 41 is located on the first channel 12 and made of material having a work function φ1, the second portion 42 is located on the second channel 13 and made of material having a work function φ2, and the third portion 43 is located on the third channel 15 and made of material having a work function φ3. The work function φ3 is higher than the work function φ1, and the work function φ2 is higher than the work function φ3. In such an approach, an absolute value of a threshold voltage Vt2 of a second transistor 3 becomes higher than each of absolute values of threshold voltages Vt1, Vt3 of first and third transistors 2, 4. Therefore, the second channel 13 is less likely to be inverted to an n-type, as compared to the first and third channels 12, 15. Alternatively, the work function φ1 of the first portion 41 can be equal to the work function φ3 of the third portion 43.

According to the seventh embodiment, the memory device 106 employs an n-channel structure. Alternatively, the memory device 106 can employ an p-channel structure. In the case of the p-type structure, the work function φ1 of the first portion 41 needs to be higher than the work function φ2 of the second portion 42. In such an approach, the absolute value of the threshold voltage Vt2 of the second transistor 3 can be higher than the absolute value of the threshold voltage Vt1 of the first transistor 2.

Such changes and modifications are to be understood as being within the scope of the present invention as defined by the appended claims.

What is claimed is:

1. A nonvolatile semiconductor memory device configured to be electrically erased and programmed, the memory device comprising:
a first conductive type semiconductor substrate having a first side and a second side opposite to the first side, the substrate including a source and a drain that are formed near a surface of the first side of the substrate and spaced apart from each other, each of the source and drain having a second conductive type opposite to the first conductive type;
a floating gate disposed on a channel region of the substrate through an electrically insulating film, the channel region being located between the source and the drain and having a first end portion near the drain, a second end portion near the source, and a middle portion between the first and second end portions, the first and second end portions having approximately same width; and
a control gate at least partially capacitively coupled to the floating gate, wherein
the memory device is configured to be electrically erased by a hot carrier generated in the first end portion of the channel region due to avalanche breakdown between the substrate and the drain, wherein
the channel region has an electric field concentration zone, where an electric field in the channel region reaches a maximum during a program operation, wherein
the electric field concentration zone is located in the middle portion between the first and second end portions of the channel region, and wherein
a distance between the electric field concentration zone and the first end portion of the channel region is greater than or equal to 0.06 μm.

2. A nonvolatile semiconductor memory device configured to be electrically erased and programmed, the memory device comprising:
a first conductive type semiconductor substrate having a first side and a second side opposite to the first side, the substrate including a source and a drain that are formed near a surface of the first side of the substrate and spaced apart from each other, each of the source and drain having a second conductive type opposite to the first conductive type;
a floating gate disposed on a channel region of the substrate through an electrically insulating film, the channel region being located between the source and the drain and having a first end portion near the drain, a second end portion near the source, and a middle portion between the first and second end portions, the first and second end portions having approximately same width; and
a control gate at least partially capacitively coupled to the floating gate, wherein
the memory device is configured to be electrically erased by a hot carrier generated in the first end portion of the channel region due to avalanche breakdown between the substrate and the drain, wherein
the channel region has an electric field concentration zone, where an electric field in the channel region reaches a maximum during a program operation, wherein
the electric field concentration zone is located in the middle portion between the first and second end portions of the channel region, wherein
the semiconductor substrate, the floating gate, and the control gate define first and second transistors, wherein
the channel region includes a first channel extending from the drain and a second channel located adjacent to the second channel, wherein
the electric field concentration zone is located in the first channel, wherein
the first channel is included in the first transistor, and the second channel is included in the second transistor, and wherein
an absolute value of a threshold voltage of the second transistor is greater than an absolute value of a threshold voltage of the first transistor in a condition where the floating gate is an electrically neutral.

3. The memory device according to claim 2, wherein
the control gate includes a stacked portion stacked on the floating gate and capacitively coupled to the floating gate and an extended portion located on the channel region of the substrate and alighted with the floating gate with a predetermined gap, and wherein
the electric field concentration zone is located directly below the floating gate or located on the source side with respect to the floating gate.

4. The memory device according to claim 3, wherein
the stacked portion of the control gate is included in the first transistor.

5. The memory device according to claim 4, wherein
the second channel extends to the source, and wherein
the extended portion of the control gate is included in the second transistor.

6. The memory device according to claim 2, wherein
the control gate is entirely stacked on and capacitively coupled to the floating gate.

7. The memory device according to claim 2, wherein
an impurity concentration of the second channel is greater than an impurity concentration of the first channel.

8. The memory device according to claim 2, wherein
the insulating film interposed between the floating gate and the surface of the substrate includes a first film portion and a second film portion, wherein
the first film portion is located on the first channel, and the second film portion is located on the second channel, and wherein
a thickness of the second film portion is greater than a thickness of the first film portion.

9. The memory device according to claim 2, wherein
the floating gate includes a first gate portion located on the first channel and a second gate portion in contact with the first gate portion and located on the second channel, wherein
the first gate portion is made of a material having a first work function, and wherein
the second gate portion is made of a material having a second work function different from the first work function.

10. The memory device according to claim 9, wherein the first conductive type is a p-type, and the second conductive type is an n-type, and wherein the second work function of the second gate portion is greater than the first work function of the first gate portion.

11. The memory device according to claim 2, wherein the surface of the first side of the substrate is provided with a slope that causes the substrate to have a first thickness and a second thickness greater than the first thickness, each of the first and second thicknesses being defined as a distance from the first side to the second side of the substrate, wherein the first transistor is located at the first thickness side, and the second transistor is located at the second thickness side, and wherein a height of the slope is greater than a thickness of an inversion layer that is formed in the second channel by application of a predetermined voltage to the control gate.

* * * * *